United States Patent
Pyo et al.

(10) Patent No.: US 10,431,300 B2
(45) Date of Patent: Oct. 1, 2019

(54) NONVOLATILE MEMORY DEVICE AND OPERATING METHOD OF NONVOLATILE MEMORY DEVICE

(71) Applicant: SAMSUNG ELECTRONICS CO., LTD., Suwon-si, Gyeonggi-Do (KR)

(72) Inventors: Suk-Soo Pyo, Hwaseong-si (KR); Hyuntaek Jung, Seoul (KR); Taejoong Song, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/936,696

(22) Filed: Mar. 27, 2018

(65) Prior Publication Data

US 2019/0051351 A1  Feb. 14, 2019

(30) Foreign Application Priority Data

Aug. 11, 2017 (KR) .......... 10-2017-0102540

(51) Int. Cl.

| G11C 11/00 | (2006.01) |
|---|---|
| G11C 13/00 | (2006.01) |
| G11C 29/50 | (2006.01) |
| G11C 11/16 | (2006.01) |
| G11C 5/14 | (2006.01) |

(Continued)

(52) U.S. Cl.
CPC .......... *G11C 13/0028* (2013.01); *G11C 5/147* (2013.01); *G11C 11/1655* (2013.01); *G11C 11/1657* (2013.01); *G11C 11/1659* (2013.01); *G11C 11/1673* (2013.01); *G11C 11/1697* (2013.01); *G11C 13/003* (2013.01); *G11C 13/004* (2013.01); *G11C 13/0026* (2013.01); *G11C 13/0033* (2013.01); *G11C 13/0038* (2013.01); *G11C 13/0069* (2013.01); *G11C 29/028* (2013.01); *G11C 29/50* (2013.01); *G11C 7/14* (2013.01); *G11C 7/227* (2013.01); *G11C 8/08* (2013.01); *G11C 2013/0054* (2013.01); *G11C 2029/5006* (2013.01); *G11C 2213/79* (2013.01); *G11C 2213/82* (2013.01)

(58) Field of Classification Search
CPC ............ G11C 13/0028; G11C 13/0026; G11C 13/0038; G11C 13/004; G11C 13/0069; G11C 29/50
See application file for complete search history.

(56) References Cited

U.S. PATENT DOCUMENTS

| 6,754,123 B2 | 6/2004 | Perner et al. | |
|---|---|---|---|
| 7,405,960 B2 * | 7/2008 | Cho | G11C 7/14 |
| | | | 365/148 |

(Continued)

FOREIGN PATENT DOCUMENTS

KR  10-2010-000536  1/2010

*Primary Examiner* — Pho M Luu
(74) *Attorney, Agent, or Firm* — F. Chau & Associates, LLC

(57) ABSTRACT

A memory device includes a delay locked loop that generates a first code for delaying a reference clock in a first operation mode that is a normal operation mode, generates a second code for delaying the reference clock in a second operation mode that is a refresh mode, and delays the reference clock in response to one of the first and second codes depending on one of the first and second operation modes, and a data output circuit that outputs a data strobe signal (DQS) using the delayed reference clock.

19 Claims, 10 Drawing Sheets

(51) Int. Cl.
  *G11C 29/02* (2006.01)
  *G11C 7/14* (2006.01)
  *G11C 8/08* (2006.01)
  *G11C 7/22* (2006.01)

(56) References Cited

U.S. PATENT DOCUMENTS

| | | |
|---|---|---|
| 7,495,471 B2 | 2/2009 | Perisetty |
| 8,089,822 B1 | 1/2012 | Chankya et al. |
| 8,436,675 B2 | 5/2013 | Chen |
| 8,988,929 B2 | 3/2015 | Park et al. |
| 9,171,856 B2 | 10/2015 | Tsai |
| 9,251,866 B2 | 2/2016 | Chun |
| 9,275,718 B2 | 3/2016 | Kim |
| 9,312,000 B1 | 4/2016 | Song |
| 9,437,289 B2 | 9/2016 | Oh et al. |
| 9,443,588 B2 | 9/2016 | Tseng et al. |
| 9,449,686 B2 * | 9/2016 | Kwon ................ G11C 13/0026 |
| 9,601,196 B2 * | 3/2017 | Zaitsu ................ G11C 13/0069 |

* cited by examiner

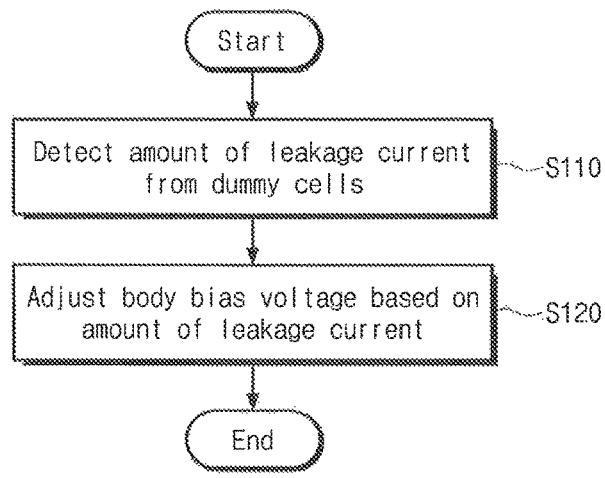
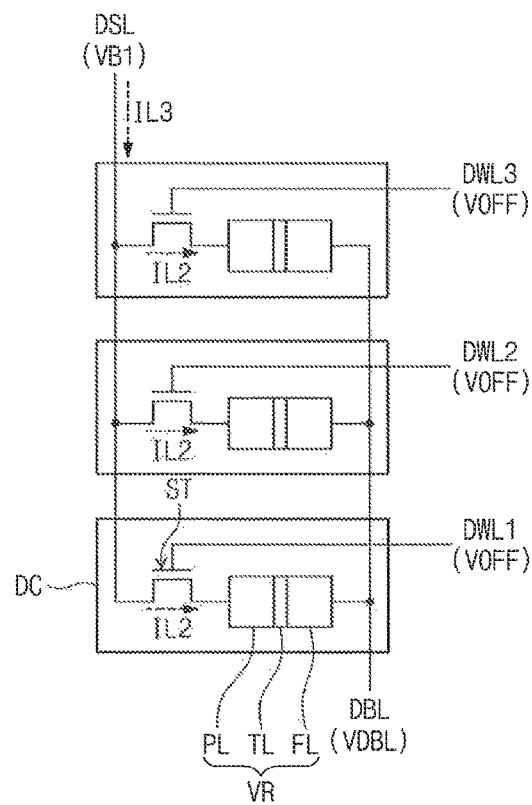

NONVOLATILE MEMORY DEVICE AND OPERATING METHOD OF NONVOLATILE MEMORY DEVICE

CROSS-REFERENCE TO RELATED APPLICATIONS

Technical Field

A claim for priority under 35 U.S.C. § 119 is made to Korean Patent Application No. 10-2017-0102540 filed on Aug. 11, 2017, in the Korean Intellectual Property Office, the entire contents of which are incorporated by reference herein.

Discussion of the Related Art

Embodiments of the inventive concept relate to a semiconductor memory, and more particularly, relate to a nonvolatile memory device and an operating method of the nonvolatile memory device.

A nonvolatile memory device is a type of a memory that retains data stored therein even at power-off. The nonvolatile memory device includes a read only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FRAM), etc.

Memory cells of the PRAM, MRAM, RRAM, and FRAM may leak a current due to their structural characteristics. The leaked current (hereinafter referred to as a "leakage current") is a flow of a current generated inadvertently. The leakage current may cause an error in an operation of the nonvolatile memory device, particularly when the amount of leakage current during operation of the memory device is not uniform.

SUMMARY

Embodiments of the inventive concept are directed to increase the reliability of a nonvolatile memory device by controlling a leakage current of memory cells.

According to an embodiment of the inventive concept, a nonvolatile memory device includes a memory cell array including a plurality of memory cells and dummy cells formed on a body, a row decoder connected to the memory cells through word lines, a dummy bit line bias circuit connected to the dummy cells through a dummy bit line; a dummy word line bias circuit connected to the dummy cells through a plurality of dummy word lines in which the dummy word line bias circuit is configured to apply a same or a different voltage to respective ones of the dummy word lines to turn off selected dummy cells and adjust a leakage current flowing through the dummy cells, a write driver and sense amplifier connected to the memory cells through bit lines, wherein a leakage current in the memory cells is maintained at a substantially uniform level through adjustment of the dummy leakage current.

According to an embodiment of the inventive concept, a nonvolatile memory device includes a memory cell including memory cells and dummy cells, a row decoder connected to the memory cells through word lines, a dummy word line bias circuit connected to the dummy cells through dummy word lines, a write driver and sense amplifier connected to the memory cells through bit lines and connected to the dummy cells through a dummy bit line, a dummy bit line bias circuit connected to the dummy cells through the dummy word lines, a source line driver connected to the memory cells through source lines and connected to the dummy cells through a dummy source line, a leakage detector connected to the dummy cells through the dummy source line and detecting an amount of leakage current flowing through the dummy cells, and a body bias circuit adjusting a bias voltage of a body, in which the memory cells and the dummy cells are formed, depending on the amount of the leakage current.

According to an embodiment of the inventive concept, an operating method of a nonvolatile memory device which includes memory cells and dummy cells includes detecting an amount of leakage current flowing through the dummy cells, and adjusting a bias voltage of a body, in which the memory cells and the dummy cells are formed, depending on the amount of the leakage current.

According to an embodiment of the inventive concept, the variable resistance elements in each of the dummy cells may include a pinned layer, a tunneling layer, and a free layer, wherein the pinned layer has a fixed magnetization direction, and the free layer has a magnetization direction that varies according to a voltage or current applied to the variable resistance element VR.

According to an embodiment of the inventive concept, the leakage detector activates or deactivates an enable signal output to the body bias circuit depending on the amount of the leakage current flowing through the dummy cells.

According to an embodiment of the inventive concept, the memory cell array further includes reference cells connected to the source line driver through a reference source line and is connected to the write driver and sense amplifier through a reference bit line, and are connected to the word lines.

According to an embodiment of the inventive concept, each of the reference cells has the same structure as the memory cells or the dummy cells and stores a data bit determined in advance.

BRIEF DESCRIPTION OF THE DRAWINGS

The inventive concept will be better-appreciated by a person of ordinary skill in the art from the following description with reference to the following figures, wherein like reference numerals refer to like parts throughout the various figures unless otherwise specified, and wherein:

FIG. 6 is a flowchart illustrating an operating method of the nonvolatile memory device according to an embodiment of the inventive concept;

FIG. 7 illustrates an example in which the amount of leakage current from dummy cells is detected;

DETAILED DESCRIPTION

Below, embodiments of the inventive concept may be described in detail and to such an extent that a person of ordinary skill in the art will be able to implement the inventive concept without undue experimentation.

Figure 1:
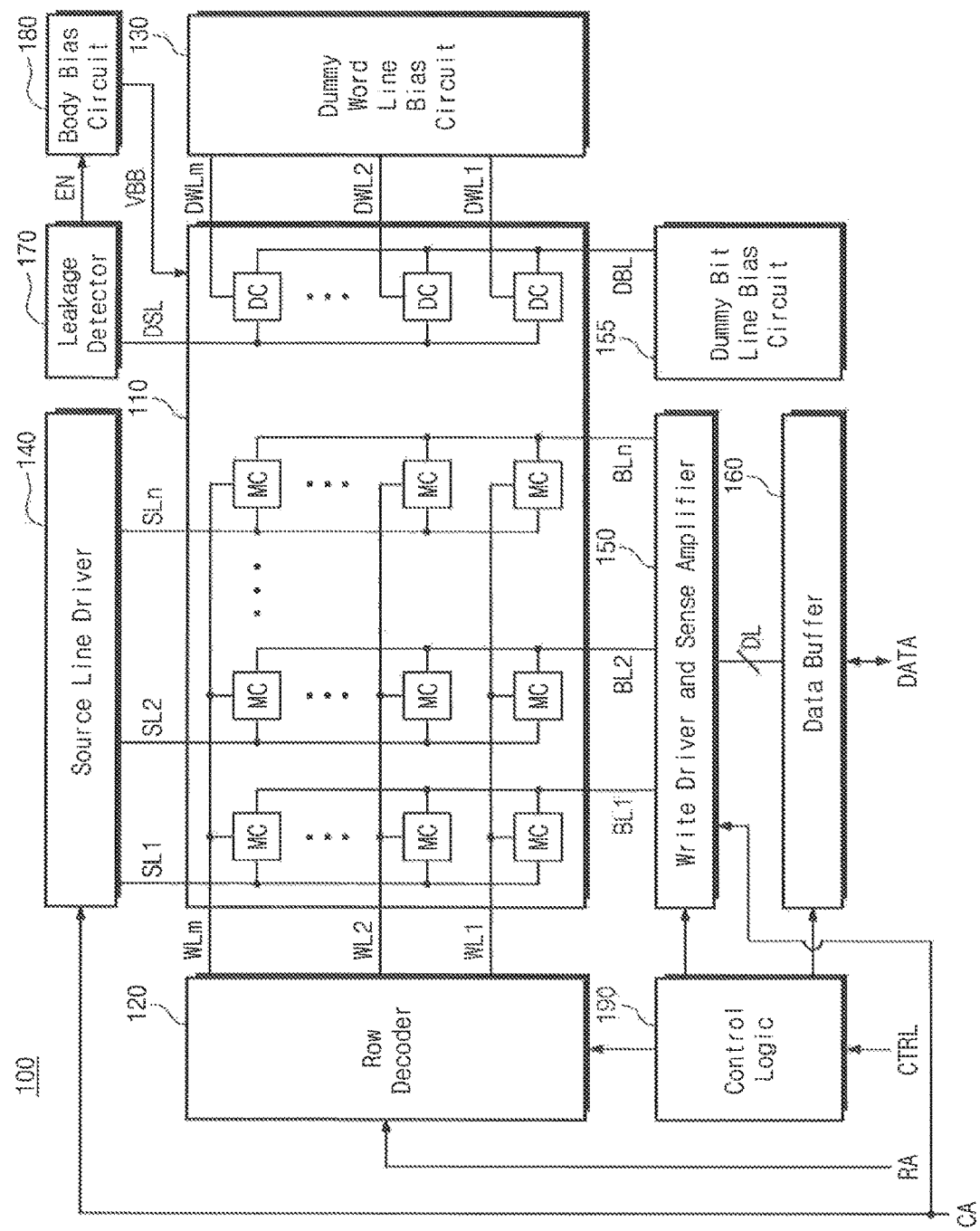
FIG. 1 illustrates a nonvolatile memory device according to an embodiment of the inventive concept.

FIG. 1 illustrates a nonvolatile memory device 100 according to an embodiment of the inventive concept. Referring to FIG. 1, the nonvolatile memory device 100 includes a memory cell array 110, a row decoder 120, a dummy word line bias circuit 130, a source line driver 140, a write driver and a sense amplifier 150, a dummy bit line bias circuit 155, a data buffer 160, a leakage detector 170, a body bias circuit 180, and control logic 190.

Figure 3:
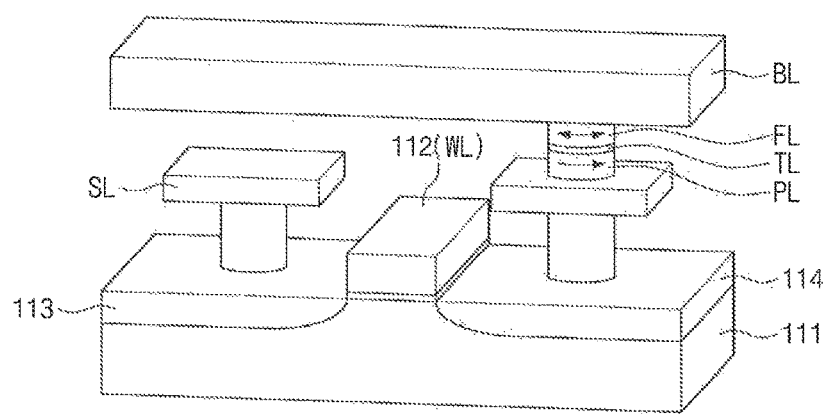
FIG. 3 illustrates an example of one memory cell.

The memory cell array 110 includes, for example, a plurality of memory cells MC and dummy cells DC are formed on a body 111 (refer to FIG. 3). The memory cells MC are connected to source lines SL1 to SLn, bit lines BL1 to BLn, and word lines WL1 to WLm. The memory cells MC may be arranged in rows and columns. The rows of memory cells MC may be respectively connected with the word lines WL1 to WLm. The column of memory cells MC may be respectively connected to the source lines SL1 to SLn and to the bit lines BL1 to BLn.

The dummy cells DC are connected to a dummy source line DSL, a dummy bit line DBL, and dummy word lines DWL1 to DWLm. The dummy cells DC may be arranged in a column. Rows of dummy memory cells DC may be respectively connected with the dummy word lines DWL1 to DWLm. The embodiment is illustrated in FIG. 1 as the memory cell array 110 includes one column of dummy cells DC. However, a person of ordinary skill in the art should understand and appreciate that according to the inventive concept, the number of columns of dummy cells DC is not limited thereto.

Figure 2:
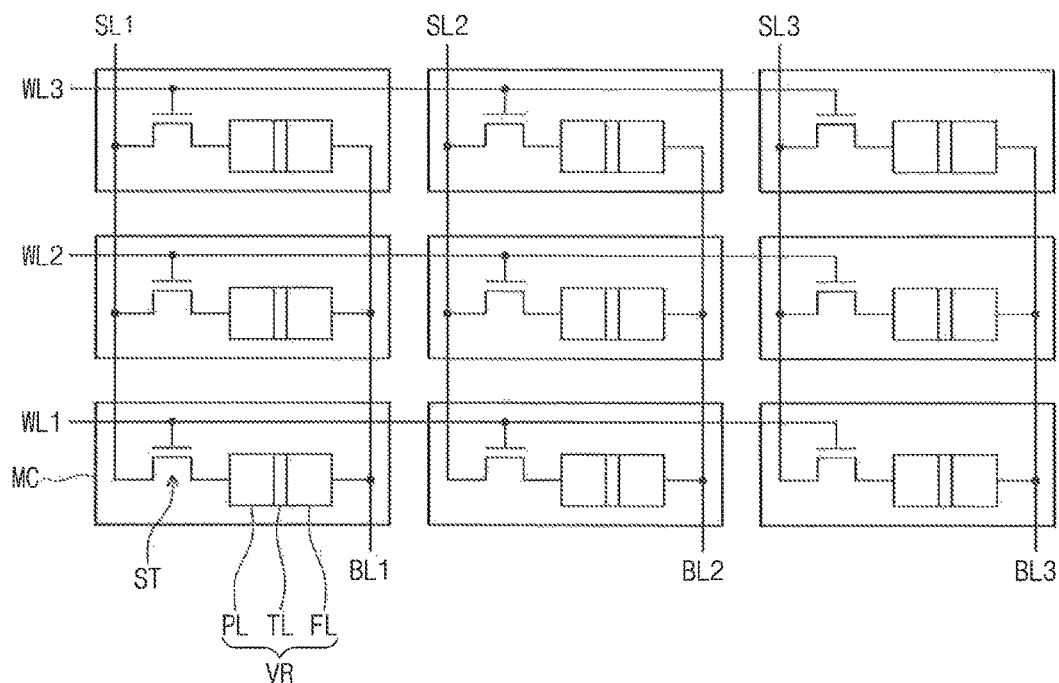
FIG. 2 illustrates an example of memory cells of a memory cell array.

In addition, the memory cells MC and the dummy cells DC may have the same structure. For example, each of the memory cells MC and the dummy cells DC may include one variable resistance element VR (see FIG. 2) and one selection transistor ST (FIG. 2). The structure of the memory cells MC and the dummy cells DC will be more fully described with reference to FIGS. 2 and 3.

With continued reference to FIG. 1, the word lines WL1 to WLm, to which the memory cells MC are connected, may be physically or electrically separated from the dummy word lines DWL1 to DWLm to which the dummy cells DC are connected. Voltages of the word lines WL1 to WLm may be controlled independently of voltages of the dummy word lines DWL1 to DWLm.

The row decoder 120 may receive a row address RA from an external device. The row decoder 120 may also control voltages of the word lines WL1 to WLm depending on the row address RA. For example, the row decoder 120 may apply a voltage for a read or a write operation to a word line selected by the row address RA and may apply a voltage(s) for inhibiting a read or write operation to other unselected other word lines.

The dummy word line bias circuit 130 may control voltages of the dummy word lines DWL1 to DWLm. For example, the dummy word line bias circuit 130 may apply voltages for turning off selection transistors of the dummy cells DC to the dummy word lines DWL1 to DWLm. For example, the dummy word line bias circuit 130 may apply the same voltage or may apply different voltages to the dummy word lines DWL1 to DWLm. According to an embodiment of the inventive concept, by the application of a voltage to respective ones of the dummy word lines to turn off selected dummy cells and adjust a dummy leakage current flowing through the dummy cells, a memory cell leakage current may be maintained at a substantially uniform level through adjustment of the dummy leakage current, as both the memory cells and the dummy cells may be formed on the same body. Through maintaining the memory cell leakage current at a substantially uniform level, a read margin may be maintained or increased to reduce or prevent an operational error.

The source line driver 140 is connected with the memory cells MC through the source lines SL1 to SLn. In a read operation or a write operation, the source line driver 140 may apply a voltage for a read operation or a write operation to a source line selected by a column address CA from the external device. The source line driver 140 may apply a voltage(s) for inhibiting a read or write operation to unselected other source lines.

The write driver and sense amplifier 150 (or a write driver and sense amplifier circuit) is connected with the memory cells MC through the bit lines BL1 to BLn. In the read operation or the write operation, the write driver and sense amplifier 150 may apply a write current (or voltage) to a bit line selected by the column address CA or may sense a current (or voltage) of the selected bit line. The write driver and sense amplifier 150 may apply a voltage(s) for inhibiting a read or write operation to unselected other bit lines.

As also shown in FIG. 1, the dummy bit line bias circuit 155 is connected with the dummy cells DC through the dummy bit line DM The dummy bit line bias circuit 155 may apply a voltage for detection of a leakage current to the dummy bit line DBL. The dummy bit line bias circuit 155 may apply a ground voltage to the dummy bit line DBL.

The data buffer 160 is connected to the write driver and sense amplifier 150 through data lines DL. The data buffer 160 may exchange data "DATA" with the external device. The data buffer 160 may load the data "DATA" transferred from the external device onto a write driver of the write driver and sense amplifier 150. The data buffer 160 may transfer data sensed by a sense amplifier of the write driver and sense amplifier 150 to the external device.

The leakage detector 170 may detect a leakage current flowing through the dummy cells DC. For example, a current flowing through the dummy cells DC when the dummy word line bias circuit 130 applies a turn-off voltage to the dummy word lines DWL1 to DWLm may be a leakage current. The leakage detector 170 may activate or deactivate an enable signal EN as the amount of the leakage current varies.

The body bias circuit 180 may adjust a body bias voltage VBB to be supplied to the body 111 (refer to FIG. 3) of the memory cell array 110 in response to the enable signal EN. For example, if the amount of the leakage current increases, the body bias circuit 180 may decrease the body bias voltage VBB. If the amount of the leakage current decreases, the body bias circuit 180 may increase the body bias voltage VBB.

The control logic 190 may control write and read operations of the nonvolatile memory device 100. The control logic 190 may control levels of voltages to be applied in the write or read operation, timings to apply the voltages, and operation timings of components of the nonvolatile memory device 100.

FIG. 2 illustrates an example of the memory cells MC of the memory cell array 110. An array of 3-by-3 memory cells MC are connected to first to third source lines SL1 to SL3, first to third bit lines BL1 to BL3, and first to third word lines WL1 to WL3 are exemplified in FIG. 2. FIG. 3 illustrates an example of one of the memory cells MC. Referring to FIGS. 1 to 3, one memory cell includes a selection transistor ST and a variable resistance element VR.

The selection transistor ST is formed in the body 111 and includes a first junction 113 connected with a source line SL, a second junction 114 formed in the body 111 and connected with a bit line BL through the variable resistance element VR, and a gate 112 formed above the body 111 between the first junction 113 and the second junction 114 and forming a word line WL.

The variable resistance element VR includes a pinned layer PL, a tunneling layer TL, and a free layer FL. The pinned layer PL has a fixed magnetization direction. The free layer FL has a magnetization direction that varies according to a voltage (or current) applied to the variable resistance element VR.

Resistance of the variable resistance element VR may be varied according to Whether or not a magnetization direction of the free layer FL is the same as a magnetization direction of the pinned layer PL (or how similar) or different from the magnetization direction of the pinned layer PL (or how different). The variable resistance element VR may store data in the forma of a resistance magnitude.

For example, the memory cell MC and the dummy cell DC may share the body 111. The gate 112 may extend in a direction perpendicular to the bit line BL so as to be connected with the gate 112 of the memory cell MC in another column. Gates of memory cells in the same row may be connected with each other to form the word line WL.

Figure 4:
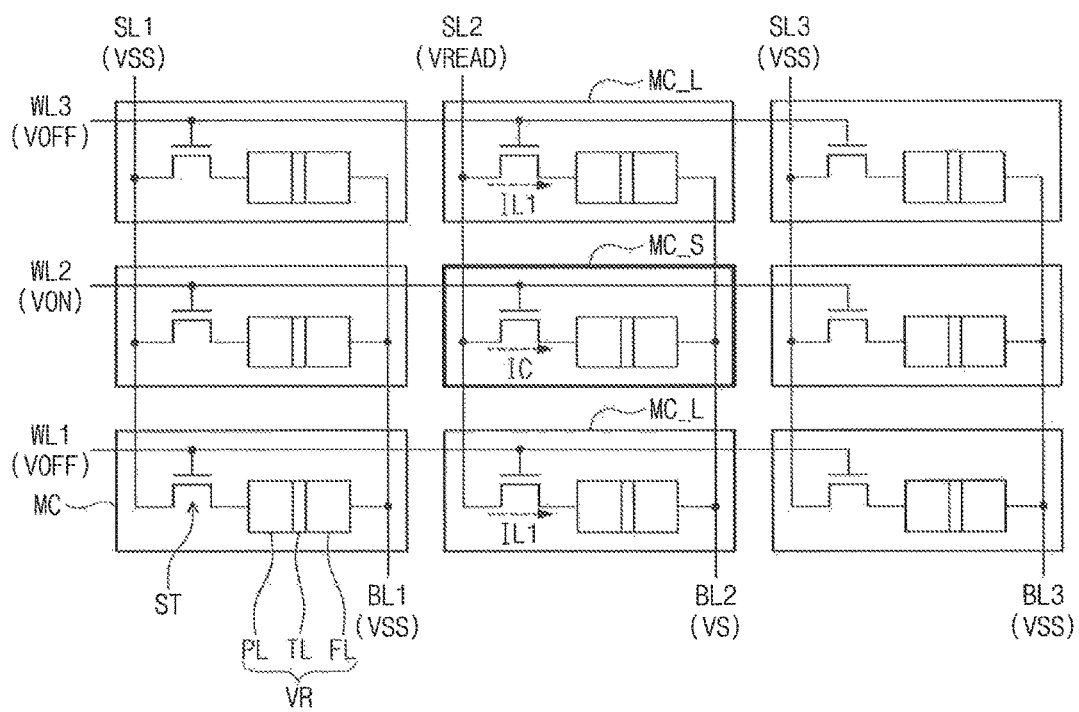
FIG. 4 illustrates an example in which a leakage current is generated in the memory cells of FIG. 2 during a read operation.

FIG. 4 illustrates an example in which a leakage current is generated in the memory cells MC of FIG. 2 during a read operation. In an embodiment, it is assumed that a memory cell corresponding to a second source line SL2, a second bit line BL2, and a second word line WL2 is a selected memory cell MC_S and other memory cells are unselected memory cells.

In a read operation, a leakage current may be generated in memory cells sharing a source line and a bit line with the selected memory cell MC_S. For example, it is assumed that memory cells causing the leakage current are leakage memory cells MC_L. In FIG. 4, memory cells connected to the second source line SL2 and the second bit line BL2 and the first and third word lines WL1 and WL3 may be the leakage memory cells MC_L.

During the read operation, a read voltage VREAD is applied to the selected second source line SL2, and a read inhibit voltage, for example, a ground voltage VSS is applied to the unselected first and third source lines SL1 and SL3. Sensing is perforated in the selected second bit line BL2, and the read inhibit voltage, for example, the ground voltage VSS is applied to the unselected first and third bit lines BL1 and BL3.

A turn-on voltage VON for turning on the selection transistor ST is applied to the selected second word line WL2. A turn-off voltage VOFF for turning off the selection transistors ST is applied to the unselected first and third word line WL1 and WL3. Accordingly, the selection transistors ST connected to the second word line WL2 are turned on, and the selection transistors ST connected to the first and third word lines WL1 and WL3 are turned off.

The same read inhibit voltage is applied to the first source line SL1 and the first bit line BL1. Accordingly, a current does not flow to memory cells connected to the first source SL1 and the first bit line BL1. Likewise, the same read inhibit voltage is applied to the third source line SL3 and the third bit line BL3. Accordingly, a current does not flow to memory cells connected to the third source line SL3 and the third bit line BL3.

A voltage (e.g., a sensing voltage VS) of the second bit line BL2 may be set to be lower than the read voltage VREAD. Accordingly, a current may flow from the second source line SL2 to the second bit line BL2 through the selected memory cell MC_S. The current flowing through the selected memory cell MC_S is referred to as an "in-cell current IC". The resistance of the variable resistance element VR of the selected memory cell MC_S may be measured by measuring the magnitude of the in-cell current IC, and thus, data may be read.

As the read voltage VREAD of the second bit line BL2 is higher than the sensing voltage VS of the second bit line BL2, even though the selection transistors ST of the leakage memory cells MC_L are turned off, a leakage current may flow through the leakage memory cells MC_L. A leakage current flowing through each leakage memory cell MC_L may be a first leakage current IL1.

The write driver and sense amplifier 150 may read data stored in the selected memory cell MC_S based on the amount of current flowing through the second bit line BL2. The in-cell current IC is a dominant component of a current flowing through the second bit line BL2. However, the first leakage current IL1 flowing through the leakage memory cells MC_L may also have an influence on a current flowing to the second bit line BL2.

In the case where the amount of the first leakage current IL1 flowing through each leakage memory cell MC_L is fixed, the write driver and sense amplifier 150 may apply the fixed amount of leakage current to read data. However, the first leakage current IL1 may vary depending on a change in a peripheral environment.

Figure 5:
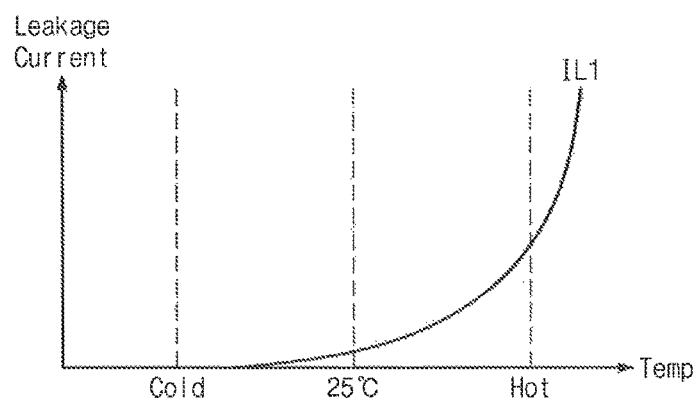
FIG. 5 illustrates an example of a change in a first leakage current.

FIG. 5 illustrates an example of a change in the first leakage current IL1. In FIG. 5, a horizontal axis represents a temperature Temp, and a vertical axis represents the amount of leakage current. Referring to FIG. 5, the amount of the first leakage current IL1 may exponentially increase as a temperature Temp increases in a hot direction with respect to a room temperature (e.g., 25° C.). The amount of the first leakage current IL1 decreases as the temperature Temp decreases in a cold direction. The change in the temperature, which may change the amount of leakage current, may affect a read margin and a write margin. The read margin is the noise margin while reading, and a write margin is the noise margin while writing.

Referring again to FIGS. 1 to 4, if the amount of the first leakage current IL1 varies depending on a change in environment, a read margin of the write driver and sense amplifier 150 decreases. For example, the probability that a read error is generated increases. To prevent the above issue, the nonvolatile memory device 100 according to an embodiment of the inventive concept includes the dummy cells DC, the dummy word line bias circuit 130, the dummy bit line bias circuit 155, the leakage detector 170, and the body bias circuit 180.

The dummy word line bias circuit 130, the dummy bit line bias circuit 155, and the leakage detector 170 control voltages of the dummy word lines DWL1 to DWLm, the dummy bit line DBL, and the dummy source line DSL such that a leakage current flows in the dummy cells DC. The leakage detector 170 may detect the amount of leakage current flowing through each dummy cell DC. The body bias circuit 180 adjusts the body bias voltage VBB depending on the detected current amount.

If the body bias voltage VBB is adjusted, a leakage current flowing through each dummy cell DC is adjusted. The nonvolatile memory device 100 according to an embodiment of the inventive concept may adjust the body bias voltage VBB such that the amount of leakage current flowing through each dummy cell DC is uniform even though an environment (e.g., a temperature) varies. If the amount of leakage current flowing through each dummy cell DC is adjusted, the amount of leakage current of each of the memory cells MC sharing the body 111 is adjusted. Accordingly, the reliability of the nonvolatile memory device 100 may be improved.

FIG. 6 is a flowchart illustrating an operating method of the nonvolatile memory device 100 according to an embodiment of the inventive concept. Referring to FIGS. 1 and 6, in operation S110, the nonvolatile memory device 100 may detect the amount of leakage current from the dummy cells DC. For example, the dummy word line bias circuit 130 may apply a turn-off voltage(s) to the dummy word lines DWL1 to DWLm. The turn-off voltage may include a ground voltage.

The dummy bit line bias circuit 155 may apply the ground voltage to the dummy bit line DBL. The leakage detector 170 may apply a first bias voltage VB1 (refer to FIG. 7) to the dummy source line DSL. The voltages applied to the dummy word lines DWL1 to DWLm, the dummy bit line DBL, and the dummy source line DSL may cause a leakage current in the dummy cells DC. The leakage detector 170 may detect the amount of leakage current flowing through the dummy source line DSL.

In operation S120, the nonvolatile memory device 100 may adjust the body bias voltage VBB based on the amount of leakage current. The leakage detector 170 may activate or deactivate the enable signal EN depending on the detected leakage current amount. The body bias circuit 180 may adjust the body bias voltage VBB in response to the enable signal EN.

FIG. 7 illustrates an example in which the amount of leakage current from the dummy cells DC is detected, 3-by-1 dummy cells DC connected to the dummy source line DSL, the dummy bit line DBL, and the first to third dummy word lines DWL1 to DWL3 are exemplified in FIG. 7. Each of the dummy cells DC may include the selection transistor ST and the variable resistance element VR. The variable resistance element VR may include the pinned layer PL, the tunneling layer TL, and the free layer FL. The structure of each dummy cell DC, may be the same as the structure illustrated in FIG. 3.

The dummy word line bias circuit 130 may apply a turn-off voltage(s) VOFF to the dummy word lines DWL1 to DWL3. The turn-off voltage VOFF may include a ground voltage. The dummy bit line bias circuit 155 may apply a dummy bit line voltage VDBL to the dummy bit line DBL. The dummy bit line voltage VDBL may include the ground voltage.

The leakage detector 170 may apply the first bias voltage VB1 to the dummy source line DSL. The first bias voltage VB1 may be higher than the dummy bit line voltage VDBL. A second leakage current IL2 may be generated in each dummy cell DC due to a voltage difference between the first bias voltage VB1 and the dummy bit line voltage VDBL. A third leakage current IL3 that corresponds to a sum of the second leakage currents IL2 may be generated in the dummy source line DSL.

As described with reference to FIG. 4, the first leakage current IL1 of each memory cell MC may be generated by a voltage difference between the read voltage VREAD and the second bit line BL2. The amount of the first leakage current IL1 (or a sum of current amounts) may be small enough not to be easily detected by a simple detector.

To easily detect the amount of the second leakage current IL2 (or the amount of the third leakage current IL3), the second leakage current IL2 may be amplified to be greater than the first leakage current IL1. For example, a difference (e.g., a first voltage difference) between the first bias voltage VB1 and the dummy bit line voltage VDBL may be controlled to be proportional to a difference (e.g., a second voltage difference) between the read voltage VREAD and the sensing voltage VS.

The first voltage difference between the first bias voltage VB1 and the dummy bit line voltage VDBL may be controlled to be a multiple (e.g., an integer multiple or a real number multiple) of the second voltage difference between the read voltage VREAD and the sensing voltage VS. If the first voltage difference is controlled to be greater than the second voltage difference, the amount of the second leakage current IL2 may be greater than the amount of the first leakage current IL1. Accordingly, it may be easy to detect the second leakage current IL2 or the third leakage current IL3.

Figure 8:
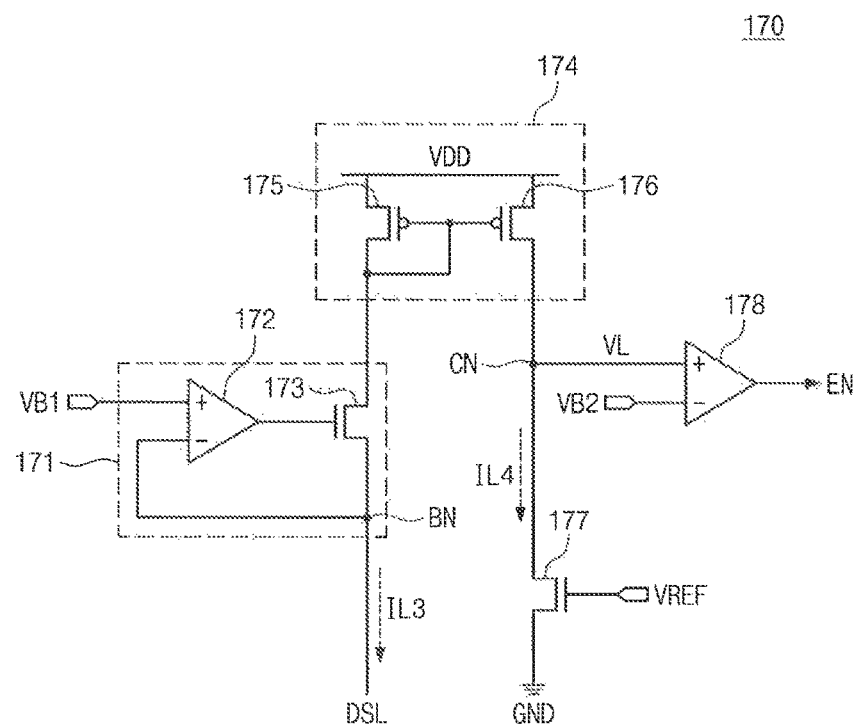
FIG. 8 illustrates an example of a leakage detector according to an embodiment of the inventive concept.

FIG. 8 illustrates an example of circuitry that may be used to construct the leakage detector 170 according to an embodiment of the inventive concept. Referring now to FIGS. 1 and 8, the leakage detector 170 may include a voltage driver 171, a current mirror 174, a resistance element 177, and a comparator 178. The voltage driver 171 may control a voltage of the dummy source line DSL. The voltage driver 171 includes a comparator 172 and a driving transistor 173.

The comparator 172 may include a positive input to which the first bias voltage VB1 is applied and a negative input connected to the dummy source line DSL. If a voltage of the dummy source line DSL is lower than the first bias voltage VB1, the comparator 172 may increase a gate voltage of the driving transistor 173. If the gate voltage of the driving transistor 173 increases, a voltage of the dummy source line DSL increases.

If a voltage of the dummy source line DSL is higher than the first bias voltage VB1, the comparator 172 may decrease a gate voltage of the driving transistor 173. If the gate voltage of the driving transistor 173 decreases, a voltage of the dummy source line DSL decreases. For example, the voltage driver 171 includes a voltage follower that maintains a voltage of the dummy source line DSL at the first bias voltage VB1.

The current mirror 174 includes a first mirror transistor 175 and a second mirror transistor 176. The first mirror transistor 175 is connected between a power node to which a power supply voltage VDD is supplied and the voltage driver 171. A gate of the first mirror transistor 175 may be connected to a node of the first mirror transistor 175, which is connected to the voltage driver 171.

With continued reference to FIG. 8, the second mirror transistor 176 is connected between the power node and a comparison node CN. A gate of the second mirror transistor 176 may be connected with the gate of the first mirror transistor 175. The current mirror 174 may mirror the third leakage current IL3 flowing through the dummy source line DSL and may output the mirrored current as a fourth leakage current IL4.

As described above, the amount of the third leakage current IL3 may be small enough so as not to be easily detected by a simple detector. To easily detect the amount of the third leakage current IL3, the fourth leakage current IL4 may be amplified to be greater than the third leakage current IL3.

For example, the size (e.g. a channel size) of the second mirror transistor 176 may be manufactured to be larger than the size (e.g., a channel size) of the first mirror transistor 175. If the size of the second mirror transistor 176 is larger than the size of the first mirror transistor 175 (e.g. the second mirror transistor 176 has a larger channel size than the first mirror transistor the amount of the fourth leakage current IL4 may be greater than the amount of the third leakage current IL3. According to the inventive concept, it may be easier to detect the fourth leakage current IL4 with such a construction.

The resistance element 177 is connected between a ground node GND to which a ground voltage is supplied and the comparison node CN. The resistance element 177 may include various elements functioning as a resistor. For example, in an embodiment of the inventive concept, the resistance element 177 may include a transistor. A reference voltage VREF may be applied to a gate of the transistor that comprises the resistance element 177. The channel size of the transistor being the resistance element 177 varies depending on the reference voltage VREF. For example, a resistance value of the resistance element 177 may be varied depending on the reference voltage VREF.

A leakage voltage VL is formed at the comparison node CN by the resistance element 177. The leakage voltage VL may be proportional to the resistance value of the resistance element 177 and may be proportional to the amount of the fourth leakage current IL4. The comparator 178 may compare the leakage voltage VL of the comparison node CN with a second bias voltage VB2. A comparison result of the comparator 178 may be output as the enable signal EN.

When the leakage voltage VL is lower than the second bias voltage VB2, the comparator 178 may deactivate the enable signal EN. When the leakage voltage VL is higher than the second bias voltage VB2, the comparator 178 may activate the enable signal EN. In other words, the comparator 178 may compare the amount of leakage current of the dummy cells DC, which is expressed by the fourth leakage current IL4, with a threshold amount expressed by the second bias voltage VB2 and may activate or deactivate the enable signal EN depending on the comparison result.

In an embodiment of the inventive concept, the first bias voltage VB1, the reference voltage VREF, and the second bias voltage VB2 may be adjusted. The leakage detector 170 may further include voltage generators (not shown) to adjust levels of the first bias voltage VB1, the reference voltage VREF, and the second bias voltage VB2.

A level of the first bias voltage VB1 may be increased to amplify the amount of the third leakage current IL3. The reference voltage VREF may be increased in consideration of the amount of the third leakage current IL3 to be amplified and/or in consideration of the amount of the fourth leakage current IL4 to be amplified with respect to the third leakage current IL3.

The second bias voltage VB2 may be increased in consideration of the amount of the third leakage current IL3 to be amplified and/or in consideration of the amount of the fourth leakage current IL4 to be amplified with respect to the third leakage current IL3. Likewise, the first bias voltage VB1, the reference voltage VREF, and the second bias voltage VB2 may be decreased to reduce the amount to be amplified.

The first bias voltage VB1, the reference voltage VREF, or the second bias voltage VB2 may be adjusted depending on settings of a manufacturer or a user, depending on a request of an external device, or a change in environment. A voltage generator that adjusts a level of the first bias voltage VB1, the reference voltage VREF, or the second bias voltage VB2 will be more fully described with reference to FIG. 13.

Figure 9:
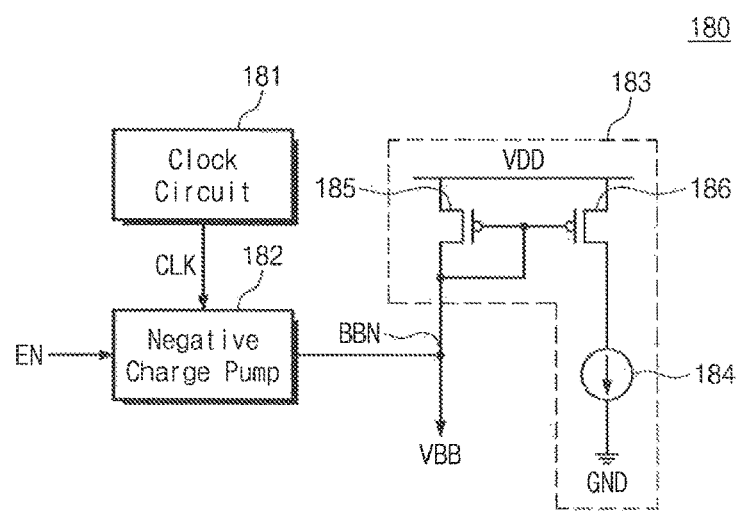
FIG. 9 illustrates an example of a body bias circuit according to an embodiment of the inventive concept.

FIG. 9 illustrates an example of the body bias circuit 180 according to an embodiment of the inventive concept. Referring to FIGS. 1 and 9, the body bias circuit 180 includes a clock circuit 181, a negative charge pump 182, and a current supply circuit 183. The clock circuit 181 may output a clock signal CLK. The clock circuit 181 may include a phase locked loop generating the clock signal CLK or a delayed-locked loop transferring an external clock signal as the clock signal CLK.

The negative charge pump 182 may receive the enable signal EN and the clock signal CLK. If the enable signal EN is deactivated, the negative charge pump 182 may also be deactivated. If the enable signal EN is activated, the negative charge pump 182 may pump a voltage of a body bias node BBN to a negative voltage in response to the clock signal CLK. The voltage of the body bias node BBN may be supplied to the body 111 (refer to FIG. 3) of the memory cell array 110 as the body bias voltage VBB.

The current supply circuit 183 may supply a current to the body 111 through the body bias node BBN. The current supply circuit 183 includes a current source 184, a first transistor 185, and a second transistor 186. The current source 184 is connected between the ground node GND to which the ground voltage is supplied and the second transistor 186. For example, the current source 184 may output a current that varies depending on a temperature. The current source 184 may be a CTAT (Complementary To Absolute Temperature) current source.

The first transistor 185 is connected between a power node VDD to which a power supply voltage is supplied and the body bias node BBN. A gate terminal of the first transistor 185 may be connected to the body bias node BBN. The second transistor 186 is connected between the power node VDD and the current source 184. A gate of the second transistor 186 may be connected with the gate of the first transistor 185. The first transistor 185 and the second transistor 186 may constitute a current mirror that mirrors a current of the current source 184.

The inventive concept If a temperature increases, the amount of the fourth leakage current IL4 (refer to FIG. 8) increases. If the leakage voltage VL is higher than the second bias voltage VB2, the negative charge pump 182 pumps a voltage of the body bias node BBN to a negative voltage. Meanwhile, if a temperature increases, the amount of current that the current source 184 outputs decreases. For example, the amount of current that is supplied to the body 111 through the body bias node BBN decreases. Accordingly, the voltage of the body bias node BBN may be determined dominantly by the negative charge pump 182, and the body bias voltage VBB may be pumped to a negative voltage.

If a temperature decreases, the amount of the fourth leakage current IL4 decreases. If the leakage voltage VL is lower than the second bias voltage VB2, the negative charge pump 182 is deactivated. Meanwhile, if a temperature decreases, the amount of current that the current source 184 outputs increases. That is, the amount of current that is supplied to the body 111 through the body bias node BBN increases. Accordingly, the voltage of the body bias node BBN may be determined dominantly by the current supply circuit 183, and the body bias voltage VBB may increase.

As described above, the negative charge pump 182 may perform a function of decreasing the body bias voltage VBB when a temperature increases. The current supply circuit 183 performs a function of increasing (or recovering) the body bias voltage VBB when a temperature decreases. The amount of leakage current of the memory cell array 110 may be maintained uniformly (or may be maintained within a given predetermined range) by the negative charge pump 182 and the current supply circuit 183.

For example, the leakage current may be maintained at a substantially uniform level, and that uniform level may be a predetermined current range. In an embodiment, the range may be, for example about 5%. In another embodiment, the range may be, for example, about 10%. In yet another embodiment, the range may be, for example, about 2%. A person of ordinary skill in the art should understand and appreciate that inventive concept is not limited to the aforementioned examples.

Figure 10:
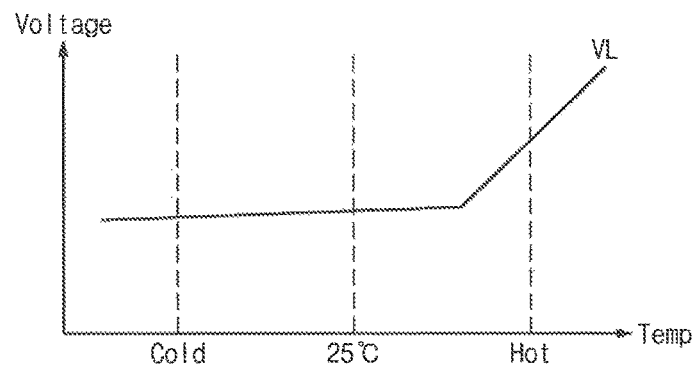
FIG. 10 illustrates a change in a leakage voltage when the body bias circuit is deactivated.

FIG. 10 illustrates a change in the leakage voltage VL when the body bias circuit 180 is deactivated. In FIG. 10, a horizontal axis represents a temperature Temp, and a vertical axis represents a voltage. Referring to FIGS. 8 and 10, the leakage voltage VL may sharply increase as a temperature Temp increases in a hot direction with respect to a room temperature (e.g., 25° C.). The leakage voltage VL gradually decreases as the temperature Temp decreases in a cold direction.

Figure 11:
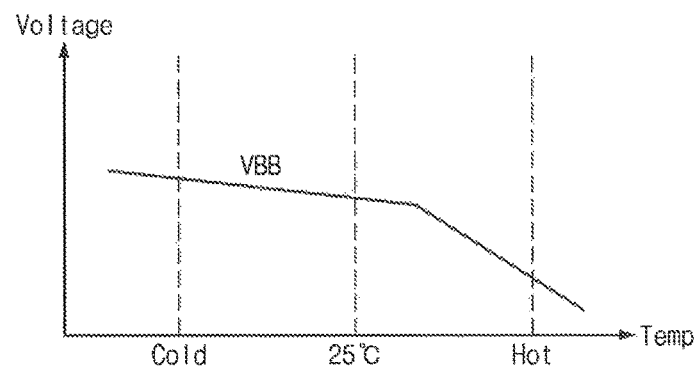
FIG. 11 illustrates a change in a body bias voltage when the body bias circuit is activated.

FIG. 11 illustrates a change in the body bias voltage VBB when the body bias circuit 180 is activated. In FIG. 11, a horizontal axis represents a temperature Temp, and a vertical axis represents a voltage. Referring to FIGS. 9 and 11, the body bias voltage VBB may sharply decrease as a temperature Temp increases in a hot direction with respect to a room temperature (e.g., 25° C.). For example, the body bias voltage VBB may sharply decrease in correspondence to a sharp increase in the leakage voltage VL as described with reference to FIG. 10.

The leakage voltage VL gradually increases as the temperature Temp decreases in a cold direction. For example, the body bias voltage VBB may gradually decrease in correspondence to a gradual increase in the leakage voltage VL as described with reference to FIG. 10.

Figure 12:
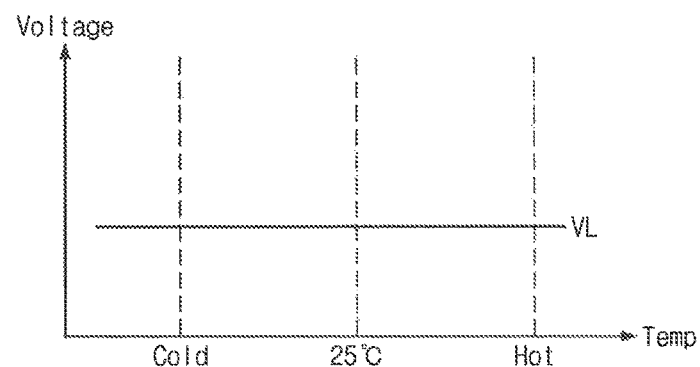
FIG. 12 illustrates a change in a leakage voltage when the body bias circuit is activated.

FIG. 12 illustrates a change in the leakage voltage VL when the body bias circuit 180 is activated. In FIG. 12, a horizontal axis represents a temperature Temp, and a vertical axis represents a voltage. Referring to FIGS. 8 and 12, a leakage voltage may be uniformly maintained (or may be maintained within a given range) regardless of whether a temperature Temp increases in a hot direction or decreases in a cold direction.

Figure 13:
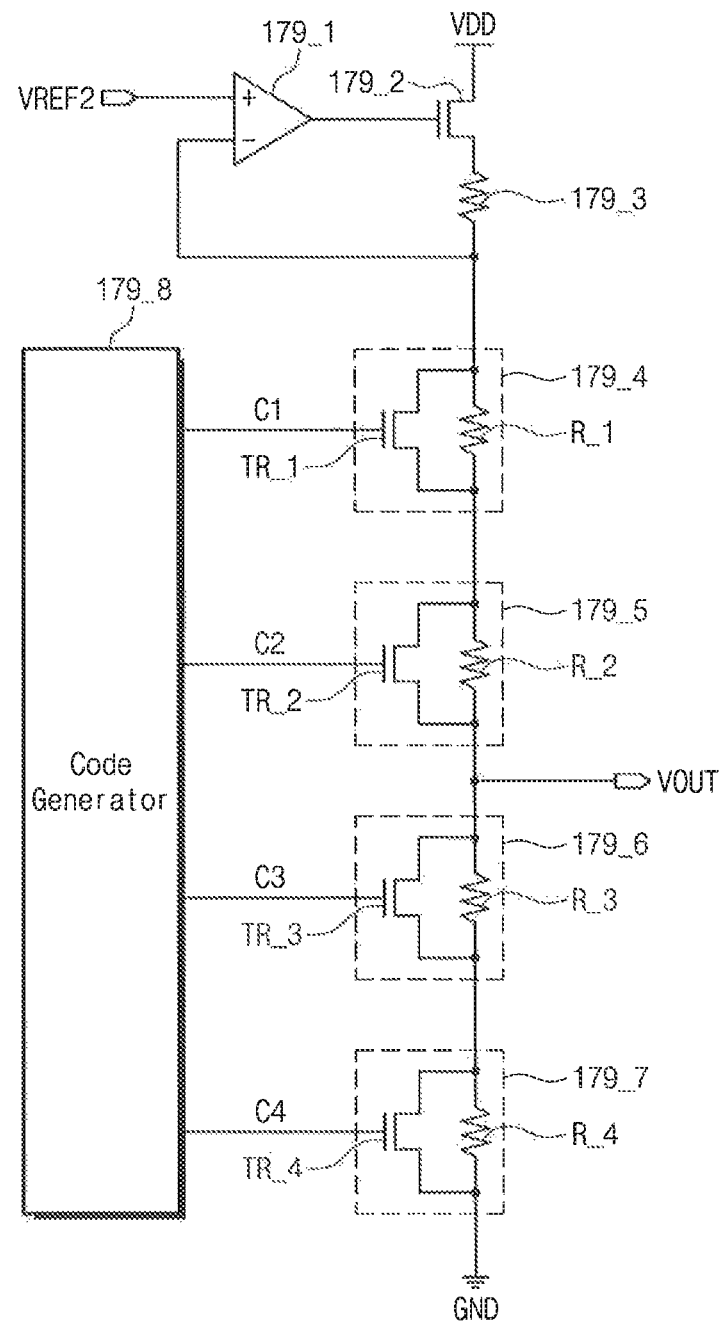
FIG. 13 illustrates an example of a voltage generator according to an embodiment of the inventive concept.

FIG. 13 illustrates an example of a voltage generator 179 according to an embodiment of the inventive concept. Referring to FIGS. 8 and 13, the voltage generator 179 includes a comparator 179_1, a second driving transistor 179_2, a resistor 179_3, first to fourth voltage division elements 179_4 to 179_7, and a code generator 179_8.

The comparator 179_1 may compare a voltage between the resistor 179_3 and the first voltage division element 179_4 with a second reference voltage VREF2. The comparator 179_1 may adjust a gate voltage of the second driving transistor 179_2 depending on the comparison result. For example, the comparator 179_1 may adjust a channel size of the second driving transistor 179_2 such that a voltage between the resistor 179_3 and the first voltage division element 179_4 is the same as the second reference voltage VREF2.

The second driving transistor 179_2 is connected between the power node VDD to which a power supply voltage (or a voltage higher than the power supply voltage) is supplied and the resistor 179_3. A gate of the second driving transistor 179_2 is adjusted depending on an output of the comparator 179_1. The second driving transistor 179_2 may control the amount of current to be supplied to the first to fourth voltage division elements 179_4 to 179_7.

The first to fourth voltage division elements 179_4 to 179_7 are connected in series between the resistor 179_3 and the ground node GND to which a ground voltage is supplied. The first voltage division element 179_4 includes a first division resistor R_1 and a first division transistor TR_1 connected in parallel. The second voltage division element 179_5 includes a second division resistor R_2 and a second division transistor TR_2 connected in parallel.

The third voltage division element 179_6 includes a third division resistor R_3 and a third division transistor TR_3 connected in parallel. The fourth voltage division element 179_7 includes a fourth division resistor R_4 and a fourth division transistor TR_4 connected in parallel. A voltage between the second and third voltage division elements 179_5 and 179_6 may be an output voltage VOUT.

The output voltage VOUT may be used as the first bias voltage VB1, the reference voltage VREF, or the second bias voltage VB2. The output voltage VOUT may have a level obtained by dividing the second reference voltage VREF2 by an up-resistance component of the first and second voltage division elements 179_4 and 179_5 and a down resistance component of the third and fourth voltage division elements 179_6 and 179_7.

The code generator 179_8 may output first to fourth codes C1 to C4. The first to fourth codes C1 to C4 are transferred to gates of the first to fourth division transistors TR_1 to TR_4, respectively. If the code generator 179_8 turns off one of the first and second division transistors TR_1 and TR_2, the up resistance component associated with the output voltage VOUT increases. Accordingly, the output voltage VOUT decreases.

If the code generator 179_8 turns on one of the first and second division transistors TR_1 and TR_2, the up-resistance component associated with the output voltage VOUT decreases. Accordingly, the output voltage VOUT increases. If the code generator 179_8 turns off one of the third and fourth division transistors TR_3 and TR_4, the down resistance component associated with the output voltage VOUT increases. Accordingly, the output voltage VOUT increases.

If the code generator 179_8 turns on one of the third and fourth division transistors TR_3 and TR_4, the down resistance component associated with the output voltage VOUT decreases. Accordingly, the output voltage VOUT decreases. As described with reference to FIG. 13, as the code generator 179_8 adjusts the first to fourth codes C1 to C4, the output voltage VOUT, that is, a level of the first bias voltage VB1, the reference voltage VREF, or the second bias voltage VB2 may be adjusted.

The voltage generator 179 may be included in the leakage detector 170 as one component of the leakage detector 170. As another example, the voltage generator 179 may be disposed outside the leakage detector 170. The code generator 179_8 may adjust the first to fourth codes C1 to C4 depending an information provided from an external device or a user, a change in environment information, or a given algorithm.

The first to fourth voltage division elements 179_4 to 179_7 and the first to fourth codes C1 to C4 are illustrated and described in FIG. 13. However, the voltage generator 179 according to the scope and spirit of the inventive concept is not limited to an example in which four voltage division elements and four codes are included therein. The number of voltage division elements and the number of codes of the voltage generator 179 may be variable.

Figure 14:
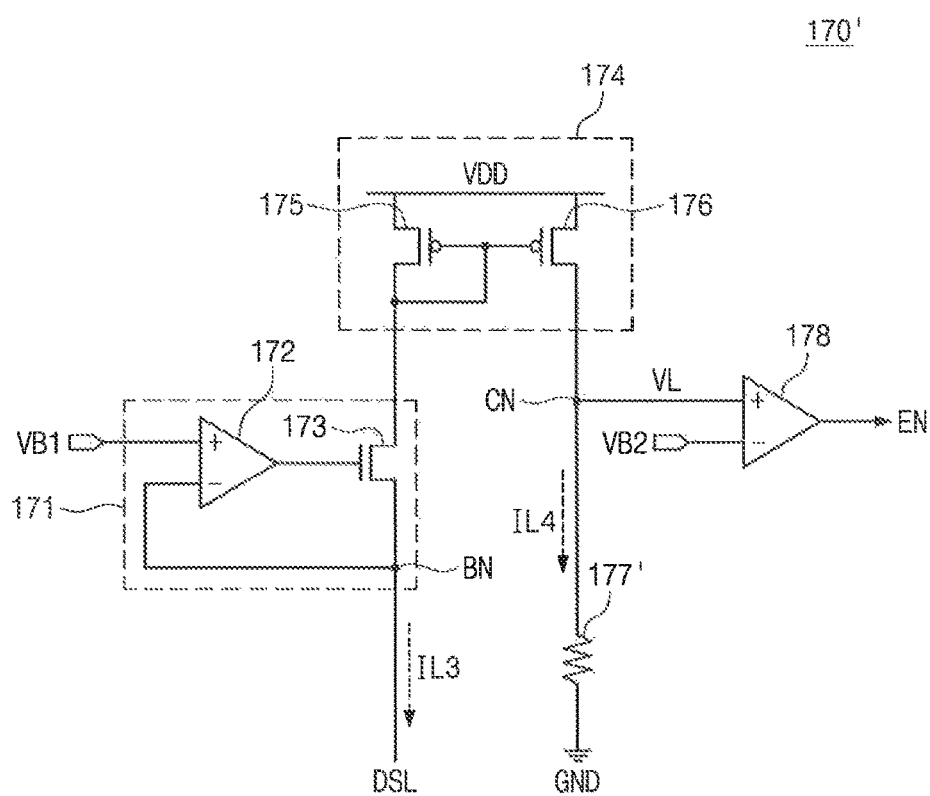
FIG. 14 illustrates the leakage detector according to an embodiment of the inventive concept.

FIG. 14 illustrates a leakage detector 170' according to another embodiment of the inventive concept. Referring to FIG. 14, the leakage detector 170' includes the voltage driver 171, the current mirror 174, a resistance element 177', and the comparator 178. Compared with the leakage detector 170 of FIG. 8, the resistance element 177' may be implemented with resistor, not a transistor. That is, the resistance element 177' may be configured to include a fixed resistor or a variable resistor.

Figure 15:
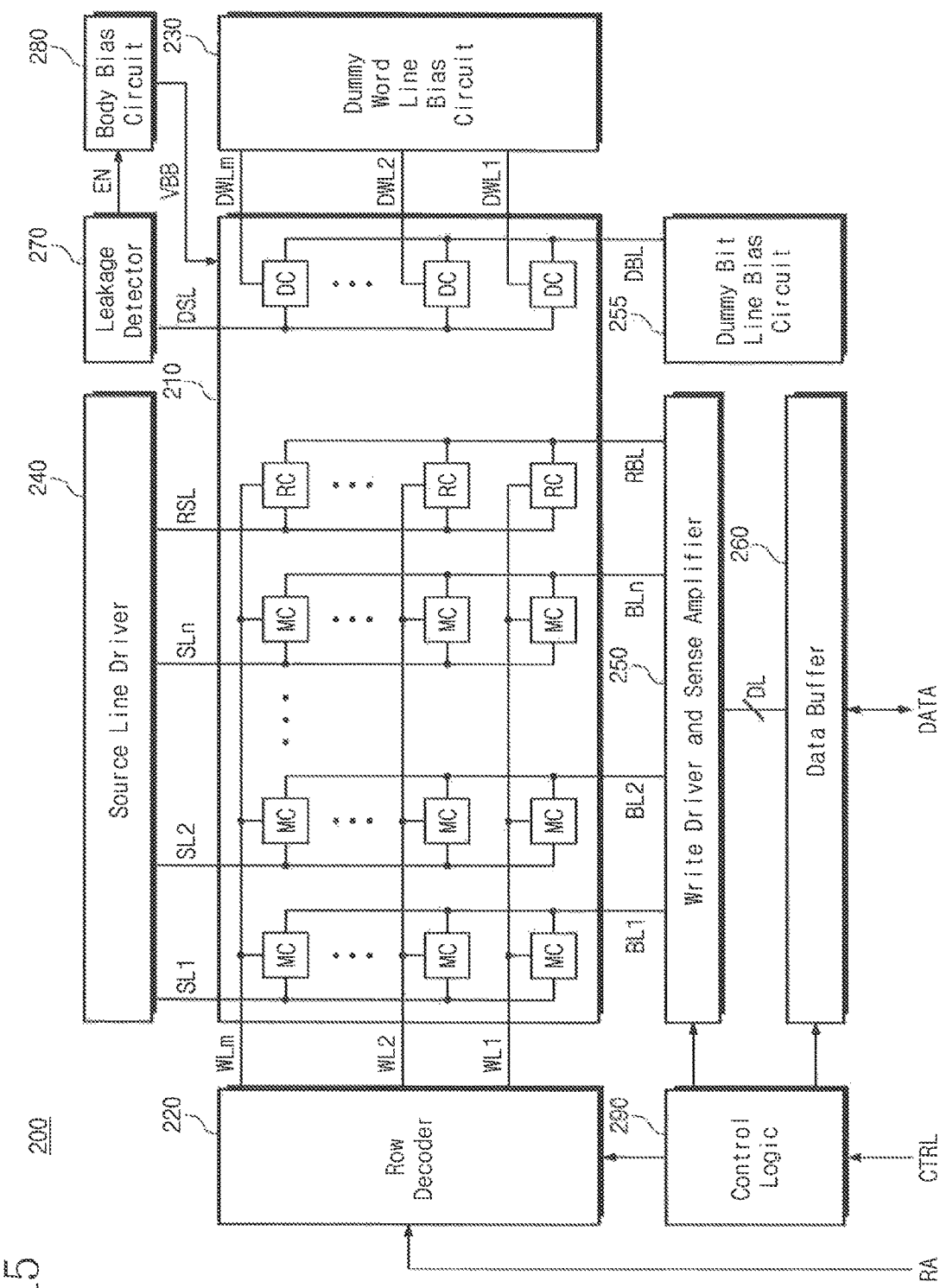
FIG. 15 is a block diagram illustrating the nonvolatile memory device according to an embodiment of the inventive concept.

FIG. 15 is a block diagram illustrating a nonvolatile memory device 200 according to an embodiment of the inventive concept. Referring to FIG. 15, the nonvolatile memory device 200 includes a memory cell array 210, a row decoder 220, a dummy word line bias circuit 230, a source line driver 240, a write driver and sense amplifier 250, a dummy bit line bias circuit 255, a data buffer 260, a leakage detector 270, a body bias circuit 280, and a control logic 290.

Compared with the nonvolatile memory device 100 of FIG. 1, the memory cell array 210 of the nonvolatile memory device 200 further includes reference cells RC. The reference cells RC are connected to the source line driver 240 through a reference source line RSL and is connected to the write driver and sense amplifier 250 through a reference bit line RBL. The reference cells RC are connected to the word lines WL1 to WLm.

During a read operation, the reference cells RC may be referenced to read data written in the memory cells MC. For example, the write driver and sense amplifier 250 may compare a current (or a voltage) flowing through a selected bit line and a current (or a voltage) flowing through the reference bit line RBL to read data of a selected memory cell.

In an embodiment of the inventive concept, each of the reference cells RC may have the same structure as the above-described memory cell MC, or the above-described dummy cell DC and may store a data bit determined in advance. As another example, each of the reference cells RC may include a resistance element having a fixed resistance value, which is suitable for reading data of the memory cells MC.

The reference cells RC are illustrated and described in FIG. 15 as being arranged in one column. However, a person of ordinary skill in the art should understand and appreciate that the reference cells RC may be arranged in two or more columns. If the reference cells RC are arranged in two or more columns, reference cells in different columns may store different data bits.

Figure 16:
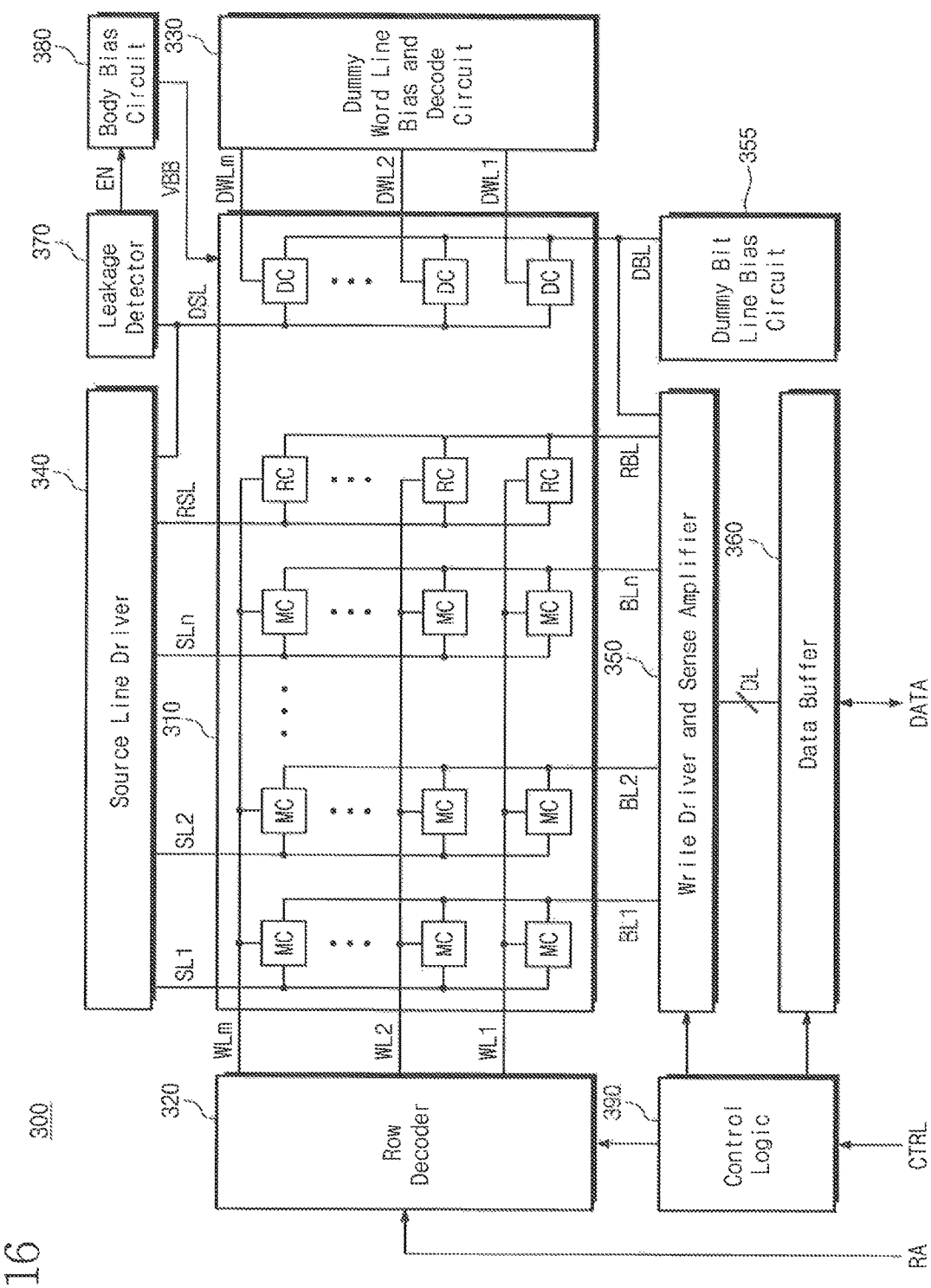
FIG. 16 is a block diagram illustrating the nonvolatile memory device according to an embodiment of the inventive concept.

FIG. 16 is a block diagram illustrating a nonvolatile memory device 300 according to an embodiment of the inventive concept. Referring to FIG. 16, the nonvolatile memory device 300 includes a memory cell array 310, a row decoder 320, a dummy word line bias and decode circuit 330, a source line driver 340, a write driver and sense amplifier 350, a dummy bit line bias circuit 355, a data buffer 360, a leakage detector 370, a body bias circuit 380, and control logic 390.

Compared with the nonvolatile memory device 200 of FIG. 15, the dummy bit line DBL of the nonvolatile memory device 300 may be connected to the write driver and sense amplifier 350. The dummy word line bias circuit 230 of the nonvolatile memory device 200 may be replaced with the dummy word line bias and decode circuit 330 of the nonvolatile memory device 300.

According to an embodiment of the inventive concept, the write driver and sense amplifier 350 and the dummy bit line bias circuit 355 may control the dummy bit line DBL alternately. The dummy source line DSL may be connected to the source line driver 340. The source line driver 340 and the leakage detector 370 may control the dummy source line DSL alternately.

For example, the nonvolatile memory device 300 may have a dummy access mode and a body bias mode. In the dummy access mode, the dummy bit line bias circuit 355 may not control the dummy bit line DBL. The leakage detector 370 may not control the dummy source line DSL.

The dummy word line bias and decode circuit 330 may select the dummy word lines DWL1 to DWLm depending on a given algorithm. For example, the dummy word line bias and decode circuit 330 may select the dummy word lines DWL1 to DWLm sequentially and one by one.

The source line driver 340 and the write driver and sense amplifier 350 may perform an access operation (e.g., a read operation or a write operation) on the dummy cell DC, which is selected by the dummy word line bias and decode circuit 330, through the dummy source line DSL and the dummy bit line DBL.

For example, in the dummy access mode, a write operation may be sequentially performed on the dummy cells DC such that specific data values (or resistance values) are written therein. In an embodiment of the inventive concept, whether the dummy cells DC retain the specific data values (or resistance values) may be checked by sequentially reading the dummy cells DC. If it is determined that a specific dummy cell does not retain a specific data value (or resistance value), a write operation may be again performed on the specific dummy cell DC so as to have the specific data value (or resistance value).

In the body bias mode, the source line driver 340 may not control the dummy source line DSL. For example, the write driver and sense amplifier 350 may apply the turn-off voltages VOFF to the dummy word lines DWL1 to DWLm as described with reference to FIGS. 1 to 13.

The dummy bit line bias circuit 355 may apply the dummy bit line voltage VDBL to the dummy bit line DBL as described with reference to FIGS. 1 to 13. The leakage detector 370 may apply the first bias voltage VB1 to the dummy source line DSL and may detect the third leakage current IL3 flowing through the dummy source line DSL. The leakage detector 370 may activate or deactivate the enable signal EN depending on the detection result.

According to an embodiment of the inventive concept described with reference to FIG. 16, a write operation or a read operation may be performed on the dummy cells DC in the dummy access mode. The resistance values of the dummy cells DC may be intentionally adjusted, and a leakage environment of the dummy cells DC may be controlled to be similar to a leakage environment of the memory cells MC. Accordingly, the body bias voltage VBB may be adjusted by the leakage detector 370 and the body bias circuit 330 so that the memory device has higher reliability than known memory devices.

According to the inventive concept, the amount of leakage current may be detected, and a body bias voltage may be adjusted according to the detected current amount to maintain the leakage current at a substantially uniform level. Accordingly, it may be possible to provide a nonvolatile memory device that has improved reliability as the amount of leakage current is uniformly maintained and an error due to a change in the amount of leakage current is prevented, and an operating method of the nonvolatile memory device.

While the inventive concept has been described with reference to one or more embodiments discussed herein, a person of ordinary skill in the art should understand and appreciate that various changes and modifications may be made without departing from the spirit and scope of the inventive concept. Therefore, it should be understood that the above embodiments are not limiting, but illustrative.

What is claimed is:

1. A nonvolatile memory device comprising:
   a memory cell array including a plurality of memory cells and dummy cells formed on a body;
   a row decoder connected to the memory cells through word lines;
   a dummy bit line bias circuit connected to the dummy cells through a dummy bit line;
   a dummy word line bias circuit connected to the dummy cells through a plurality of dummy word lines;
   a write driver and sense amplifier connected to the memory cells through bit lines;
   a source line driver connected to the memory cells through a plurality of source lines; and
   a leakage detector connected to the dummy cells through a dummy source line.

2. The nonvolatile memory device of claim 1, wherein the memory cells and the dummy cells have the same structure.

3. The nonvolatile memory device of claim 1, wherein one or more of the dummy cells include selection transistors respectively controlled by the dummy word lines and variable resistance elements, and
   wherein, during a read operation associated with the memory cells, the dummy word line bias circuit applies voltages for turning off the selection transistors of the dummy cells to the dummy word lines.

4. The nonvolatile memory device of claim 1, wherein the dummy bit line bias circuit applies a first voltage to the dummy bit line and the leakage detector applies a second voltage higher than the first voltage to the dummy source line.

5. The nonvolatile memory device of claim 4, wherein a voltage difference between the second voltage and the first voltage is proportional to a difference between a third voltage applied to a source line selected from the source lines and a fourth voltage applied to a bit line selected from the bit lines, during a read operation associated with the memory cells.

6. The nonvolatile memory device of claim 1, wherein the leakage detector detects an amount of a first leakage current flowing to the dummy source line.

7. The nonvolatile memory device of claim 6, further comprising:
   a body bias circuit configured to adjust a bias voltage of a body, in which the memory cells and the dummy cells are formed, depending on the amount of the first leakage current.

8. The nonvolatile memory device of claim 7, wherein the body bias circuit is configured to decrease the bias voltage when the amount of the first leakage current increases.

9. The nonvolatile memory device of claim 7, wherein the body bias circuit is configured to adjust the bias voltage such that the amount of the first leakage current is substantially uniform.

10. The nonvolatile memory device of claim 7, wherein the leakage detector includes:
    a voltage driver configured to control a voltage of the dummy source line by output of a first bias voltage;
    a current mirror configured to mirror the first leakage current flowing through the dummy source line to output a second leakage current;
    a resistance element configured to convert the amount of the second leakage current from the current mirror to a leakage voltage; and
    a comparator configured to compare the leakage voltage and a second bias voltage and to activate an enable signal when the leakage voltage is higher than the second bias voltage.

11. The nonvolatile memory device of claim 10, wherein the resistance element includes a transistor that has a gate connected to receive a reference voltage and transfers the second leakage current to a ground node.

12. The nonvolatile memory device of claim 10, wherein the current mirror amplifies the amount of the first leakage current to output the second leakage current.

13. The nonvolatile memory device of claim 10, wherein the body bias circuit includes:
    a negative charge pump configured to output a negative voltage to a body bias node connected to the body in response to activation of the enable signal.

14. The nonvolatile memory device of claim 13, Wherein the body bias circuit further includes:
    a current source configured to supply a bias current to the body bias node.

15. The nonvolatile memory device of claim 14, wherein the current source adjusts the amount of the bias current in an inverse proportion to a temperature.

16. A nonvolatile memory device comprising:
    a memory cell array including a plurality of memory cells and dummy cells;
    a row decoder connected to the memory cells through word lines;
    a dummy word line bias circuit connected to the dummy cells through dummy word lines;
    a write driver and sense amplifier connected to the memory cells through bit lines and connected to the dummy cells through a dummy bit line;
    a dummy bit line bias circuit connected to the dummy cells through the dummy bit line;
    a source line driver connected to the memory cells through source lines and connected to the dummy cells through a dummy source line;
    a leakage detector connected to the dummy cells through the dummy source line and configured to detect an amount of a dummy cell leakage current flowing through the dummy cells; and
    a body bias circuit configured to adjust a bias voltage of a body, in which the memory cells and the dummy cells are formed, depending on the amount of the dummy cell leakage current.

17. The nonvolatile memory device of claim 16, wherein the memory cell array further includes reference cells connected to the source line driver through a reference source line and is connected to the write driver and sense amplifier through a reference bit line, and are connected to the word lines.

18. An operating method of a nonvolatile memory device which includes memory cells and dummy cells, the method comprising:

detecting, by a leakage detector an amount of leakage current flowing through the dummy cells; and adjusting, by a body bias circuit, a bias voltage of a body, in which the memory cells and the dummy cells are formed, depending on the amount of the leakage current flowing through the dummy cells.

19. The method of claim 18, further comprising:

turning off, by a dummy word line bias circuit, selection transistors of the dummy cells prior to detecting the amount of the leakage current.

\* \* \* \* \*